(12) United States Patent
Maszara et al.

(10) Patent No.: US 8,580,642 B1
(45) Date of Patent: Nov. 12, 2013

(54) METHODS OF FORMING FINFET DEVICES WITH ALTERNATIVE CHANNEL MATERIALS

(75) Inventors: Witold P. Maszara, Morgan Hill, CA (US); Ajey P. Jacob, Albany, NY (US); Nicholas V. LiCausi, Watervliet, NY (US); Jody A. Fronheiser, Delmar, NY (US); Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 19 days.

(21) Appl. No.: 13/476,645

(22) Filed: May 21, 2012

(51) Int. Cl.
*H01L 21/336* (2006.01)
*H01L 21/84* (2006.01)
*H01L 21/00* (2006.01)

(52) U.S. Cl.
USPC ............ 438/283; 438/157; 438/197; 438/268

(58) Field of Classification Search
USPC .................................. 438/157, 197, 268, 283
See application file for complete search history.

(56) References Cited

U.S. PATENT DOCUMENTS

| | | | | |
|---|---|---|---|---|
| 7,247,887 | B2 * | 7/2007 | King et al. | 257/139 |
| 7,588,985 | B2 * | 9/2009 | Kim | 438/270 |
| 7,655,534 | B2 | 2/2010 | Sheen et al. | |
| 2008/0293203 | A1 * | 11/2008 | Yoon et al. | 438/283 |
| 2011/0101421 | A1 | 5/2011 | Xu | |
| 2011/0210404 | A1 | 9/2011 | Su et al. | |
| 2012/0315732 | A1 * | 12/2012 | Kang et al. | 438/197 |

\* cited by examiner

*Primary Examiner* — Luan C Thai
(74) *Attorney, Agent, or Firm* — Williams, Morgan & Amerson, P.C.

(57) ABSTRACT

One illustrative method disclosed herein involves performing a first etching process through a patterned hard mask layer to define a plurality of spaced-apart trenches in a substrate that defines a first portion of a fin for the device, forming a layer of insulating material in the trenches and performing a planarization process on the layer of insulating material to expose the patterned hard, performing a second etching process to remove the hard mask layer and to define a cavity within the layer of insulating material, forming a second portion of the fin within the cavity, wherein the second portion of the fin is comprised of a semiconducting material that is different than the substrate, and performing a third etching process on the layer of insulating material such that an upper surface of the insulating material is below an upper surface of the second portion of the fin.

21 Claims, 5 Drawing Sheets

METHODS OF FORMING FINFET DEVICES WITH ALTERNATIVE CHANNEL MATERIALS

BACKGROUND OF THE INVENTION

1. Field of the Invention

Generally, the present disclosure relates to the manufacture of sophisticated semiconductor devices, and, more specifically, to various methods of forming FinFET devices with alternative channel materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

As device dimensions decrease and customers demand higher performance devices, device designers are driven to develop new product designs to address these and other issues. One techniques that has been employed in the prior art has been to attempt to use alternative materials, such as III-V materials, for all or part of the fin structure. For example, one prior art technique involved performing an epitaxial deposition process to blanket-deposit a III-V material on a silicon semiconducting substrate and thereafter performing an etching process to define the fins. Other prior art techniques involved utilization of selective epitaxial growth in trench/line structures formed on an otherwise planar surface. However, these methods have not achieved widespread adoption due to a variety of reasons. What is desired is a reliable and repeatable methodology for forming fins for FinFET devices that are comprised of an alternative material to that of the substrate.

The present disclosure is directed to various methods of forming FinFET devices with alternative channel materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices with alternative channel materials. One illustrative method disclosed herein involves forming a patterned hard mask layer above a substrate comprised of a first semiconducting material, performing a first etching process through the patterned hard mask layer to define a plurality of spaced-apart trenches that define a first portion of a fin comprised of the first semiconductor material for the device and forming a layer of insulating material in the trenches. In one embodiment, the method further includes performing a planarization process on the layer of insulating material to expose the patterned hard mask positioned above the first portion of the fin, performing a second etching process to remove the hard mask and thereby expose an upper surface of the first portion of the fin and to define a cavity within the layer of insulating material, forming a second portion of the fin within the cavity, wherein the second portion of the fin is comprised of a second semiconducting material that is different than the first semiconducting material, and performing a third etching process on the layer of insulating material such that an upper surface of the insulating material is below an upper surface of the second portion of the fin.

Another illustrative method disclosed herein involves forming a patterned hard mask layer above a substrate comprised of a first semiconducting material, performing a first etching process through the patterned hard mask layer to define a plurality of spaced-apart trenches that define a first portion of a fin comprised of the first semiconductor material for the device and forming a layer of insulating material in the trenches. In one embodiment, the method further includes performing a planarization process on the layer of insulating material to expose the patterned hard mask positioned above the first portion of the fin, performing a second etching process to remove the hard mask and thereby expose an upper surface of the first portion of the fin and to define a cavity within the layer of insulating material, performing a third etching process to reduce a height of the first portion of the fin, forming a second portion of the fin on the recessed upper surface of the first portion of the fin, wherein the second portion of the fin is comprised of a second semiconducting material that is different than the first semiconducting material, and performing a fourth etching process on the layer of insulating material such that an upper surface of the insulating material is below an upper surface of the second portion of the fin.

BRIEF DESCRIPTION OF THE DRAWINGS

The disclosure may be understood by reference to the following description taken in conjunction with the accompanying drawings, in which like reference numerals identify like elements, and in which.

Figure 1A:
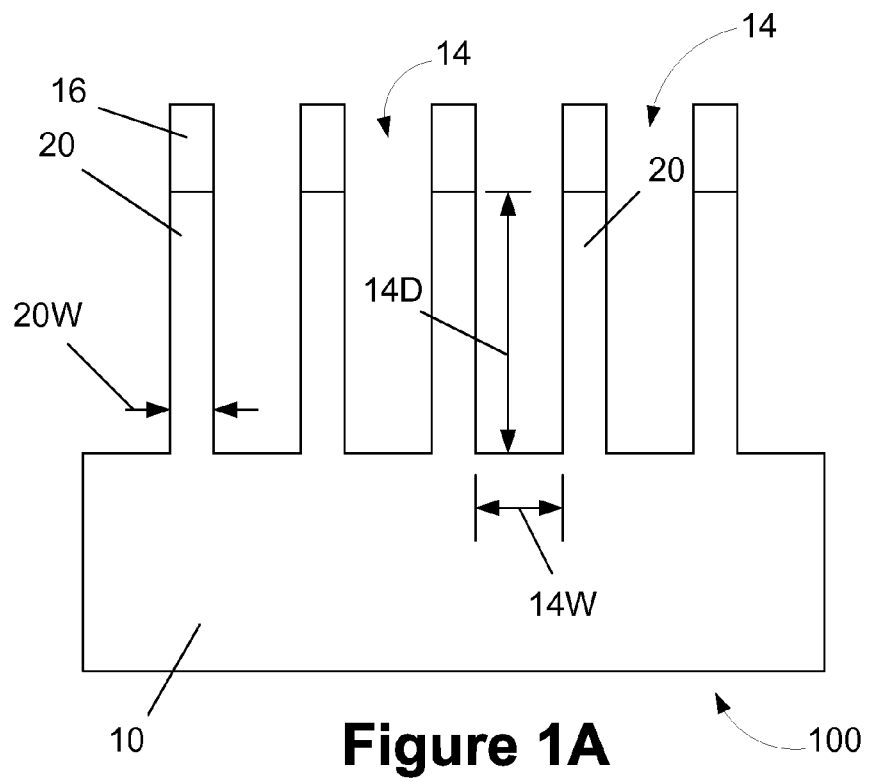
FIGS. 1A-1I depict various methods disclosed herein for of forming FinFET devices with alternative channel materials.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming FinFET devices with alternative channel materials. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

With continuing reference to FIG. 1A, an etching process, such as a dry or wet etching process, is then performed on the substrate 10 through the patterned mask layer 16 to form a plurality of trenches 14. This etching process results in the definition of a plurality of fins 20. As discussed more fully below, the fins 20 depicted in FIG. 1A will actually be a first portion of the final fin structure for the device 100. In some applications, a further etching process may be performed to reduce the width or to "thin" the fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

With continuing reference to FIG. 1A, the overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may range from about 20-50 nm. In some embodiments, the fins 20 may have a final width 20W within the range of about 5-30 nm. In the illustrative example depicted in FIGS. 1A-1G, the trenches 14 and fins 20 are all of a uniform size and shape. However, as discussed more fully below, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
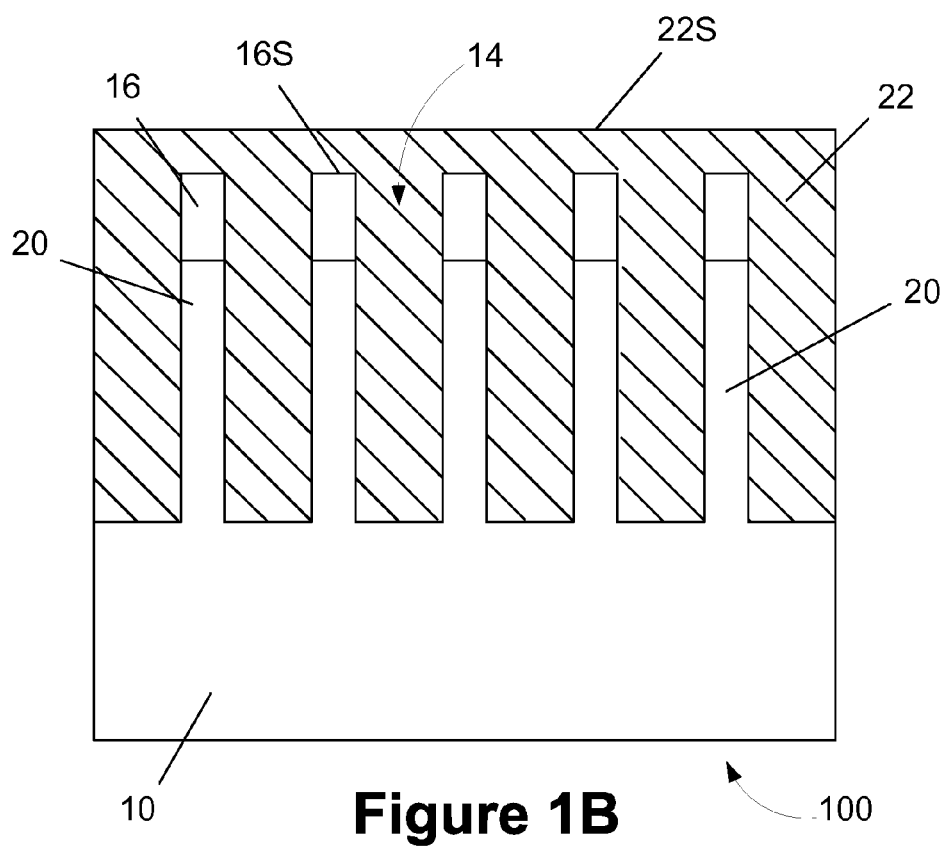

Then, as shown in FIG. 1B, a layer of insulating material 22 is formed in the trenches 14 of the device. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 1B, the surface 22S of the layer of insulating material 22 is the "as-deposited" surface of the layer 22. In this example, the surface 22S of the layer of insulating material 22 may be positioned slightly above the upper surface 16S of the mask layer 16.

Figure 1C:
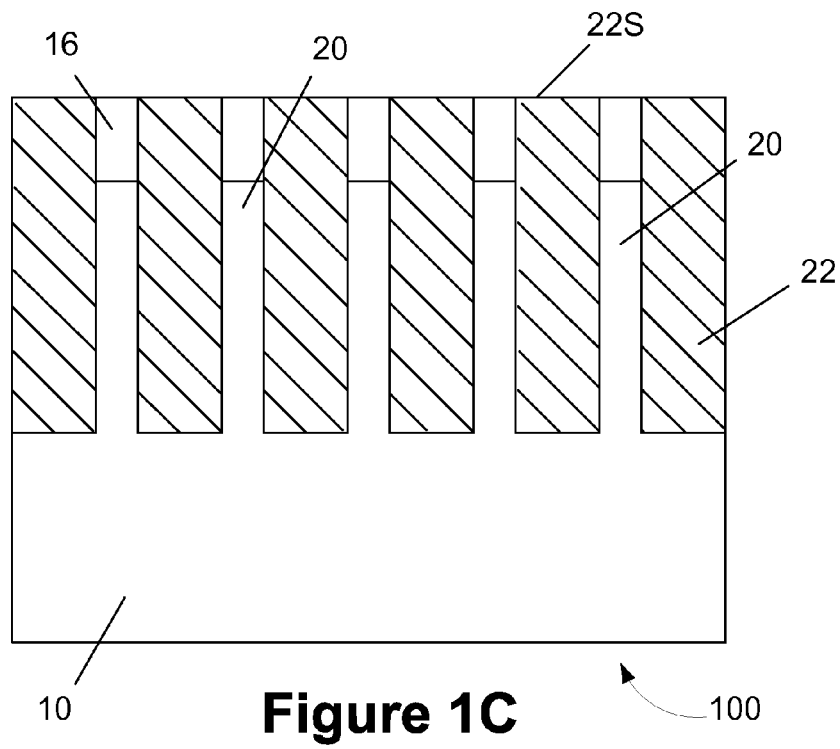

Next, as shown in FIG. 1C, one or more chemical mechanical polishing (CMP) processes may be performed to planarize the surface 22S using the mask layer 16 as a polish-stop layer. After such a CMP process, the surface 22S of the layer of insulating material 22 is substantially level with the surface 16S of the mask layer 16.

Figure 1D:
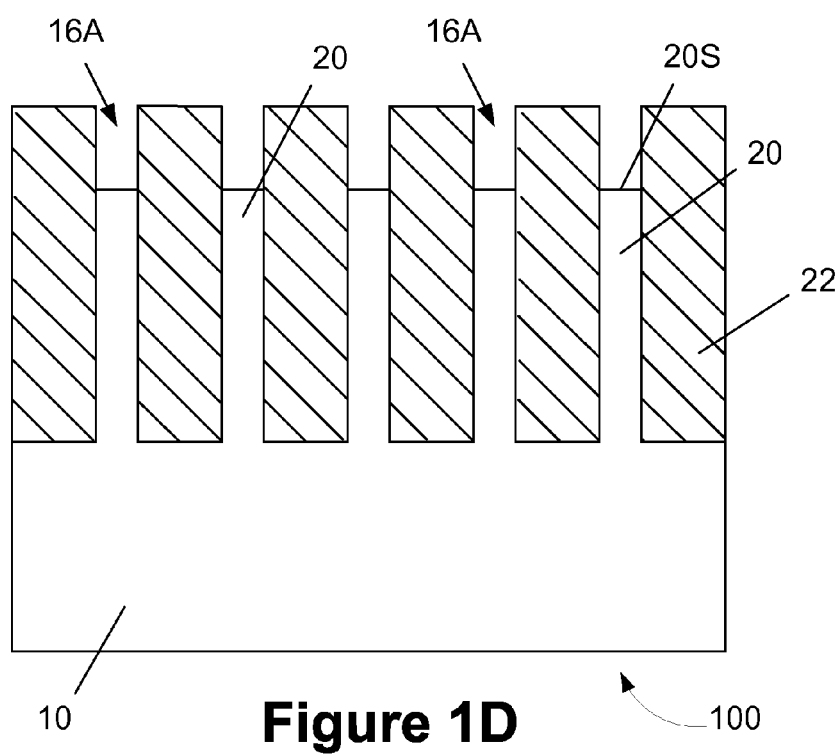

Next, as shown in FIG. 1D, an etching process is performed to remove the patterned hard mask layer 16. The etching process results in the definition of cavities 16A that expose an upper surface 20S of the fins 20.

Figure 1E:
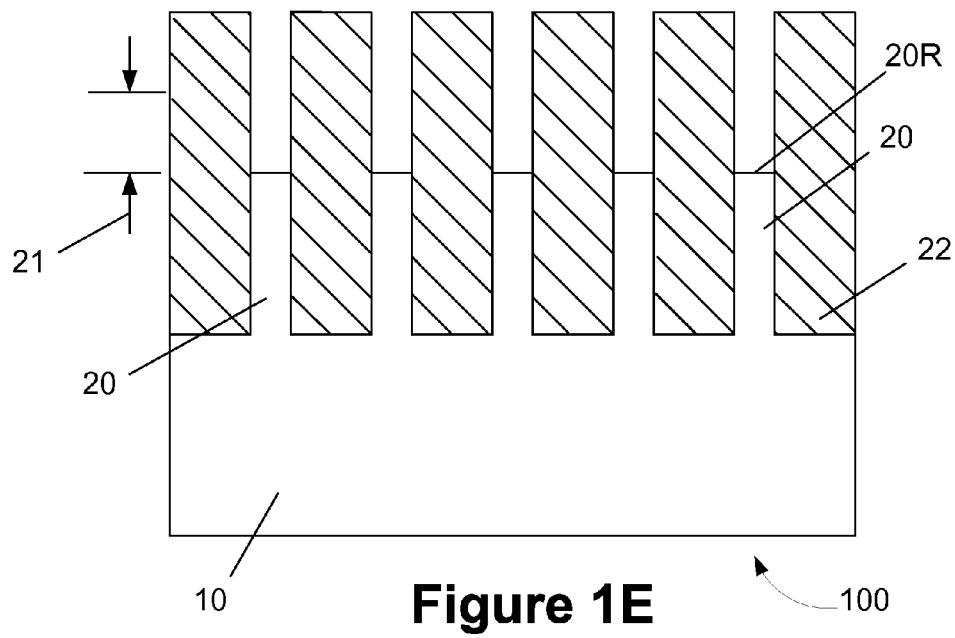

Then, as shown in FIG. 1E, an etching process is performed to recess the fins 20 by a distance 21. The etching process results in the fins 20 having a recessed surface 20R. The magnitude of the distance 21 may vary depending on the particular application. In one illustrative embodiment, the distance 21 may fall within the range of about 10-40 nm.

Figure 1F:
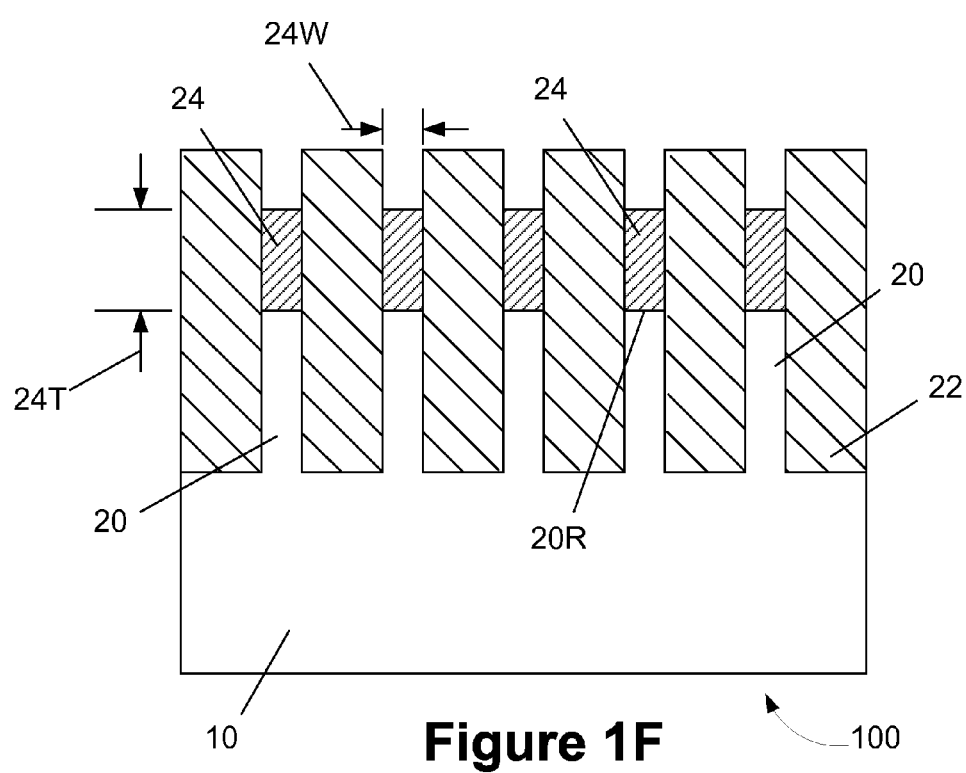

Next, as shown in FIG. 1F, an alternative fin material 24 is formed on the fins 20. In one illustrative embodiment, this alternative material 24 is actually a second portion of the final fin structure for the device 100, with the first portion of the fin being the fin 20 that is defined by etching the substrate 10. In one illustrative embodiment, an epitaxial deposition process is performed to form the alternative fin material 24. The height 24T of the alternative fin material 24 may vary depending upon the particular application, e.g., it may vary from about 10-40 nm. The alternative fin material 24 also has a width 24W that corresponds to the final width of the fins for the device 100. The alternative fin material 24 may be comprised of a variety of different materials, e.g., silicon germanium, silicon-carbon, III-V materials, II-VI materials, etc., or combinations thereof, and it may be either doped (in situ) or un-doped.

Figure 1G:
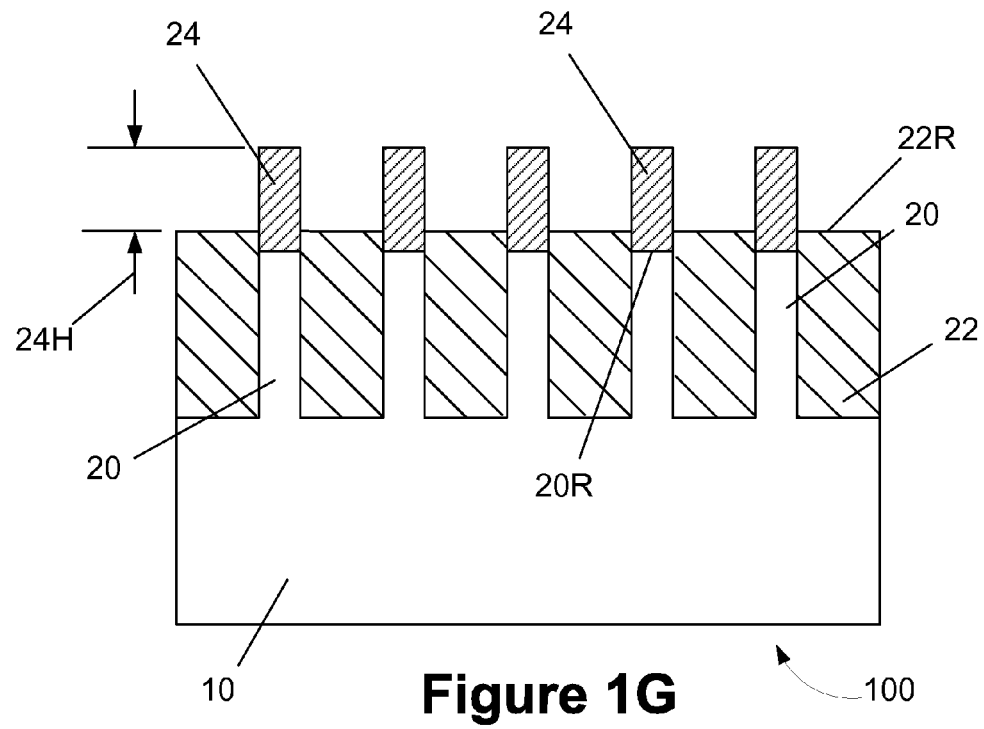

FIG. 1G depicts the device 100 after an etching process has been performed on the layer of insulating material 22 to reduce its thickness and thereby result in the layer of insulating material having a recessed surface 22R. The recessed surface 22R of the layer of insulating material 22 essentially defines the final fin height 24H of the fins 20. The fin height 24H may vary depending upon the particular application and, in one illustrative embodiment, may range from about 5-50 nm. In one illustrative example, the recessed surface 22R of the layer of insulating material 22 is positioned above the recessed surface of the fins 20R, i.e., the recessing of the layer of insulating material 22 is controlled such that only the alternative fin material 22 is exposed above the recessed surface 22R of the layer of insulating material 22. In other applications, the layer of insulating material 22 may be recessed by an amount such that the entirety of the alternative fin material 24 and a portion of the underlying fin 20 is positioned above the recessed surface 22R of the layer of insulating material 22.

Figure 1H:
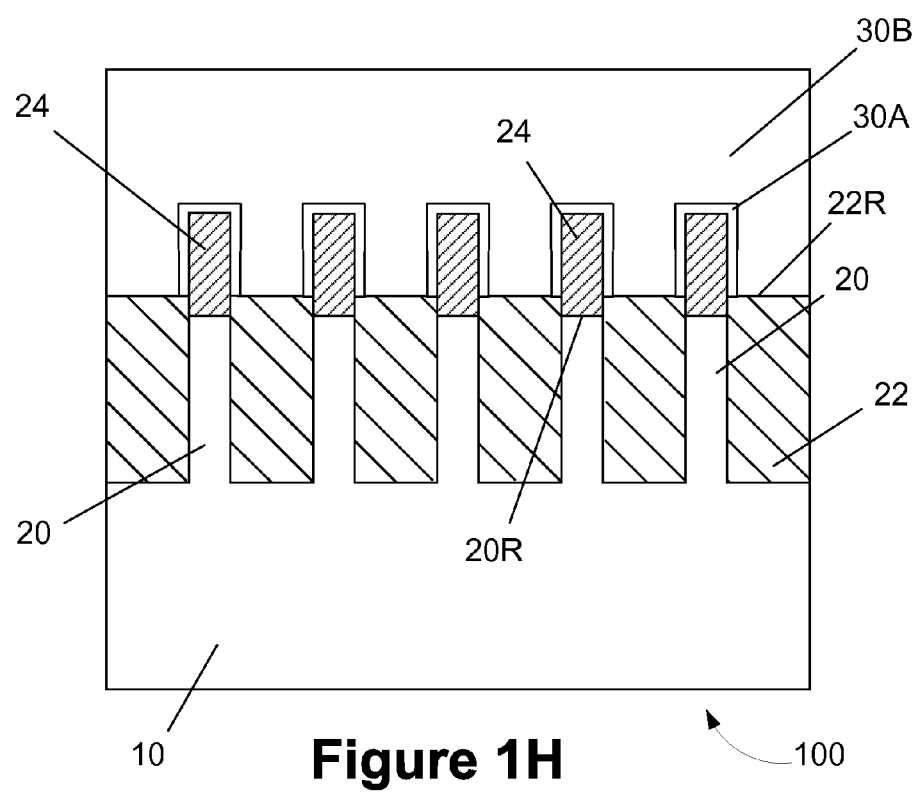

At the point of processing depicted in FIG. 1G, the illustrative FinFET device 100 may be completed using traditional fabrication techniques. For example, FIG. 1H depicts the device 100 after an illustrative gate structure has been formed for the device 100. In one illustrative embodiment, the schematically depicted gate structure includes an illustrative gate insulation layer 30A and an illustrative gate electrode 30B. The gate insulation layer 30A may be comprised of a variety of different materials, such as, for example, silicon dioxide, a so-called high-k (k greater than 5) insulation material (where k is the relative dielectric constant), etc. Similarly, the gate electrode 30B may also be of a material such as polysilicon or amorphous silicon, or it may be comprised of one or more metal layers that act as the gate electrode 30B. As will be recognized by those skilled in the art after a complete reading of the present application, the gate structure of the device 100 depicted in the drawings, i.e., the gate insulation layer 30A and the gate electrode 30B, is intended to be representative in nature. That is, the gate structure may be comprised of a variety of different materials and it may have a variety of configurations, and the gate structure may be made using either the so-called "gate-first" or "replacement gate" techniques. In one illustrative embodiment, as shown in FIG. 1H, an oxidation process or a conformal deposition process may be performed to form a gate insulation layer 30A comprised of a material such as, for example, silicon dioxide, silicon nitride, hafnium oxide, a higk-k (k value greater than 10) insulating material, etc., on the fins 20. Thereafter, the gate electrode material 30B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure by blanket-depositing a layer of spacer material and thereafter performing an anisotropic etching process to define the spacers.

Figure 1I:
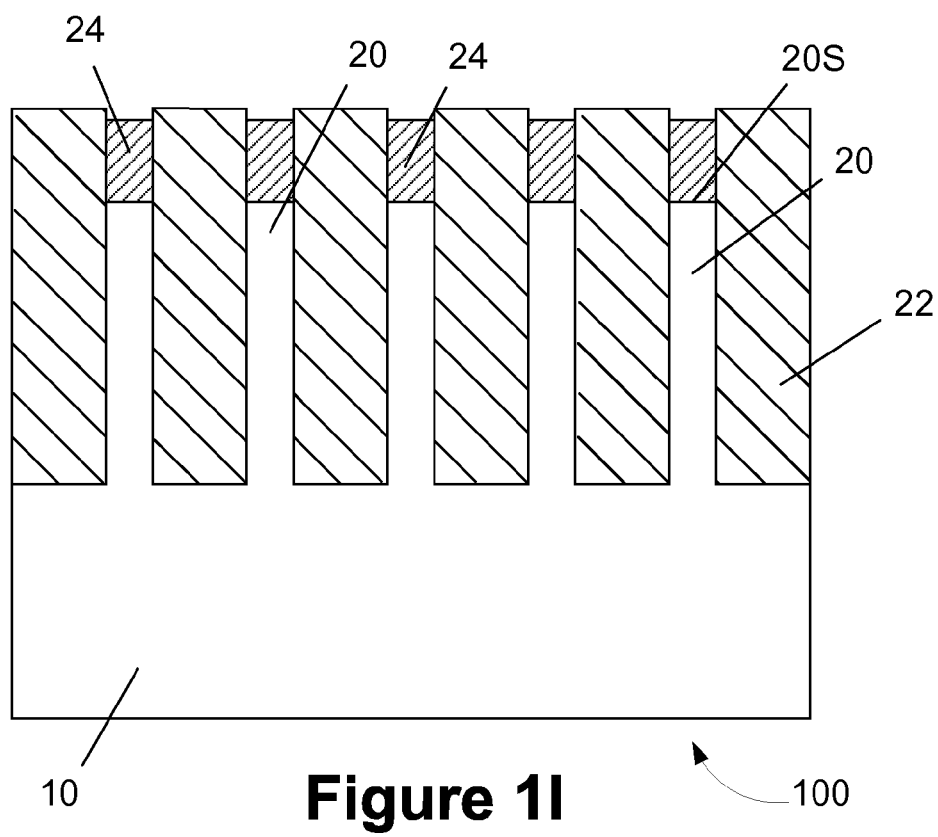

In an alternative process flow, the etching step that is performed to recess the fins 20, as depicted in FIG. 1E, may be omitted. FIG. 1I depicts the device 100 at a point in fabrication that corresponds to that shown in FIG. 1D. However, as shown in FIG. 1I, the alternative fin material 24 is formed on the exposed upper surfaces 20S of the fins 20.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
forming a patterned hard mask layer above a substrate comprised of a first semiconducting material;
performing a first etching process through said patterned hard mask layer to define a plurality of spaced-apart trenches that define a first portion of a fin comprised of said first semiconductor material for said device;
forming a layer of insulating material in said trenches, said layer of insulating material overfilling said trenches and said patterned hard mask layer;
performing a planarization process on said layer of insulating material that exposes said patterned hard mask positioned above said first portion of said fin;
performing a second etching process to remove said hard mask positioned above said first portion of said fin to thereby expose an upper surface of said first portion of said fin and to define a cavity within said layer of insulating material above said first portion of said fin;
forming a second portion of said fin within said cavity on said upper surface of said first portion of said fin, said second portion of said fin comprised of a second semiconducting material that is different than said first semiconducting material; and
performing a third etching process on said layer of insulating material such that an upper surface of said insulating material after said second etching process is performed is below an upper surface of said second portion of said fin.

2. The method of claim 1, wherein said first semiconducting material is comprised of silicon and said second semiconductor material is comprised of one of silicon, silicon-germanium, a III-V material, a II-VI material, or a combination thereof.

3. The method of claim 1, wherein said portion of said second portion of said fin that is positioned above said upper surface of said layer of insulating material defines a final fin height of said device.

4. The method of claim 1, wherein said upper surface of said layer of insulating material is positioned below said upper surface of said first portion of said fin.

5. The method of claim 1, wherein said first fin portion is formed to a final fin width for said device.

6. The method of claim 1, wherein said second fin portion is formed to a final fin width for said device.

7. The method of claim 1, wherein forming said second portion of said fin within said cavity comprises performing an epitaxial deposition process to form said second portion of said fin.

8. The method of claim 1, wherein performing said planarization process comprises performing a chemical mechanical polishing process.

9. A method of forming a FinFET device, comprising:
forming a patterned hard mask layer above a substrate comprised of a first semiconducting material;
performing a first etching process through said patterned hard mask layer to define a plurality of spaced-apart trenches that define a first portion of a fin comprised of said first semiconductor material for said device, said first portion of said fin having a width that corresponds to a final fin width of said device;
forming a layer of insulating material in said trenches, said layer of insulating material overfilling said trenches and said patterned hard mask layer;
performing a chemical mechanical polishing process on said layer of insulating material using said patterned hard mask layer as a polish stop, said chemical mechanical polishing process exposing said patterned hard mask positioned above said first portion of said fin;
performing a second etching process to remove said hard mask positioned above said first portion of said fin to thereby expose an upper surface of said first portion of said fin and to define a cavity within said layer of insulating material above said first portion of said fin;
performing an epitaxial deposition process to form a second portion of said fin within said cavity on said upper surface of said first portion of said fin, said second portion of said fin comprised of a second semiconducting material that is different than said first semiconducting material; and
performing a third etching process on said layer of insulating material such that an upper surface of said insulating material after said third etching process is performed is below an upper surface of said second portion of said fin.

10. The method of claim 9, wherein said first semiconducting material is comprised of silicon and said second semiconductor material is comprised of one of silicon, silicon-germanium, a III-V material, a II-VI material, or a combination thereof.

11. The method of claim 9, wherein said portion of said second portion of said fin that is positioned above said upper surface of said layer of insulating material defines a final fin height of said device.

12. The method of claim 9, wherein said upper surface of said layer of insulating material is positioned below said upper surface of said first portion of said fin.

13. A method of forming a FinFET device, comprising:
forming a patterned hard mask layer above a substrate comprised of a first semiconducting material;
performing a first etching process through said patterned hard mask layer to define a plurality of spaced-apart trenches that define a first portion of a fin comprised of said first semiconductor material for said device;
forming a layer of insulating material in said trenches, said layer of insulating material overfilling said trenches and said patterned hard mask layer;
performing a planarization process on said layer of insulating material that exposes said patterned hard mask positioned above said first portion of said fin;
performing a second etching process to remove said hard mask positioned above said first portion of said fin to thereby expose an upper surface of said first portion of said fin;
performing a third etching process to reduce a height of said first portion of said fin and thereby define a recessed upper surface of said first portion of said fin and to define a cavity within said layer of insulating material above said recessed upper surface of said first portion of said fin;
forming a second portion of said fin within said cavity on said recessed upper surface of said first portion of said fin, said second portion of said fin comprised of a second semiconducting material that is different than said first semiconducting material; and
performing a fourth etching process on said layer of insulating material such that an upper surface of said insulating material after said fourth etching process is performed is below an upper surface of said second portion of said fin.

14. The method of claim 13, wherein said first semiconducting material is comprised of silicon and said second semiconductor material is comprised of one of silicon, silicon-germanium, a III-V material, a II-VI material, or a combination thereof.

15. The method of claim 13, wherein said portion of said second portion of said fin that is positioned above said upper surface of said layer of insulating material defines a final fin height of said device.

16. The method of claim 13, wherein said upper surface of said layer of insulating material is positioned below said recessed upper surface of said first portion of said fin.

17. The method of claim 13, wherein said first fin portion is formed to a final fin width for said device.

18. The method of claim 13, wherein said second fin portion is formed to a final fin width for said device.

19. The method of claim 13, wherein forming said second portion of said fin within said cavity comprises performing an epitaxial deposition process to form said second portion of said fin.

20. The method of claim 13, wherein performing said planarization process comprises performing a chemical mechanical polishing process.

21. A method of forming a FinFET device, comprising:

forming a patterned hard mask layer above a substrate comprised of a first semiconducting material;

performing a first etching process through said patterned hard mask layer to define a plurality of spaced-apart trenches that define a first portion of a fin comprised of said first semiconductor material for said device, said first portion of said fin having a width that corresponds to a final fin width of said device;

forming a layer of insulating material in said trenches, said layer of insulating material overfilling said trenches and said patterned hard mask layer;

performing a chemical mechanical polishing process on said layer of insulating material using said patterned hard mask as a polish stop, said chemical mechanical polishing process exposing said patterned hard mask positioned above said first portion of said fin;

performing a second etching process to remove said hard mask positioned above said first portion of said fin to thereby expose an upper surface of said first portion of said fin;

performing a third etching process to reduce a height of said first portion of said fin and thereby define a recessed upper surface of said first portion of said fin and to define a cavity within said layer of insulating material above said recessed upper surface of said first portion of said fin;

forming a second portion of said fin within said cavity on said recessed upper surface of said first portion of said fin, said second portion of said fin comprised of a second semiconducting material that is different than said first semiconducting material; and performing a fourth etching process on said layer of insulating material such that an upper surface of said insulating material after said fourth etching process is performed is below an upper surface of said second portion of said fin.

* * * * *